US008779085B2

(12) United States Patent
Goshima et al.

(10) Patent No.: US 8,779,085 B2
(45) Date of Patent: *Jul. 15, 2014

(54) MODIFIED POLYIMIDE AND METHOD FOR PRODUCING MODIFIED POLYIMIDE

(75) Inventors: Toshiyuki Goshima, Yokohama (JP); Maw Soe Win, Yokohama (JP); Eika Kyo, Yokohama (JP)

(73) Assignee: PI R&D Co., Ltd., Yokohama-Shi, Kanagawa (JP)

( * ) Notice: Subject to any disclaimer, the term of this patent is extended or adjusted under 35 U.S.C. 154(b) by 281 days.

This patent is subject to a terminal disclaimer.

(21) Appl. No.: 13/266,925

(22) PCT Filed: Apr. 30, 2010

(86) PCT No.: PCT/JP2010/057678
§ 371 (c)(1),
(2), (4) Date: Jan. 4, 2012

(87) PCT Pub. No.: WO2010/126132
PCT Pub. Date: Nov. 4, 2010

(65) Prior Publication Data
US 2012/0097439 A1    Apr. 26, 2012

(30) Foreign Application Priority Data

Apr. 30, 2009   (JP) ................................. 2009-110914

(51) Int. Cl.
*C08G 69/36*   (2006.01)
(52) U.S. Cl.
USPC ............. 528/329.1; 528/59; 528/61; 528/64; 528/310; 528/328
(58) Field of Classification Search
USPC ................... 528/59, 61, 64, 310, 328, 329.1; 525/520, 453, 454
See application file for complete search history.

(56) References Cited

U.S. PATENT DOCUMENTS

2008/0275181 A1* 11/2008 Win et al. ...................... 524/600
2010/0132989 A1   6/2010 Fujihara et al.
(Continued)

FOREIGN PATENT DOCUMENTS

JP    2003-198105 A    7/2003
JP    2005-36025 A     2/2005
(Continued)

OTHER PUBLICATIONS

Extended European Search Report issued Dec. 12, 2012, in European Patent Application No. 10769830.0.
(Continued)

*Primary Examiner* — Michael L Leonard
(74) *Attorney, Agent, or Firm* — Birch, Stewart, Kolasch & Birch, LLP

(57) ABSTRACT

The present invention discloses a method of producing a modified polyimide comprising a polycarbonate, which modified polyimide has excellent electric properties and adhesion as well as excellent heat resistance, flexibility, bending property, low warping, chemical resistance and storage stability; and the modified polyimide. Also disclosed are a composition comprising the modified polyimide and used thereof. According to the method in which an isocyanate-terminated oligomer comprising a polycarbonate component having excellent flexibility is allowed to react with a tetracarboxylic dianhydride to synthesize a tetracarboxylic dianhydride oligomer comprising the polycarbonate component and the thus obtained oligomer is then further allowed to react with an aromatic diamine and aromatic tetracarboxylic dianhydride to produce a polyimide block copolymer, by selecting the aromatic diamine from a wide range of selectable aromatic diamines, an excellent modified polyimide satisfying all of the above-described various characteristics can be produced.

16 Claims, 1 Drawing Sheet

(56) References Cited

U.S. PATENT DOCUMENTS

2010/0155969 A1* 6/2010 Mori et al. .................. 257/798
2011/0083884 A1 4/2011 Okada et al.

FOREIGN PATENT DOCUMENTS

| | | | |
|---|---|---|---|
| JP | 2006-307183 A | 11/2006 | |
| JP | 2008-101123 A | 5/2008 | |
| JP | 2008-179751 A | 8/2008 | |
| WO | WO-2008041646 * | 10/2008 | ............. H01L 21/52 |
| WO | WO 2008/132960 A1 | 11/2008 | |
| WO | WO 2010/010831 A1 | 1/2010 | |

OTHER PUBLICATIONS

International Search Report, dated Oct. 5, 2010, issued in PCT/JP2010/057678.

* cited by examiner

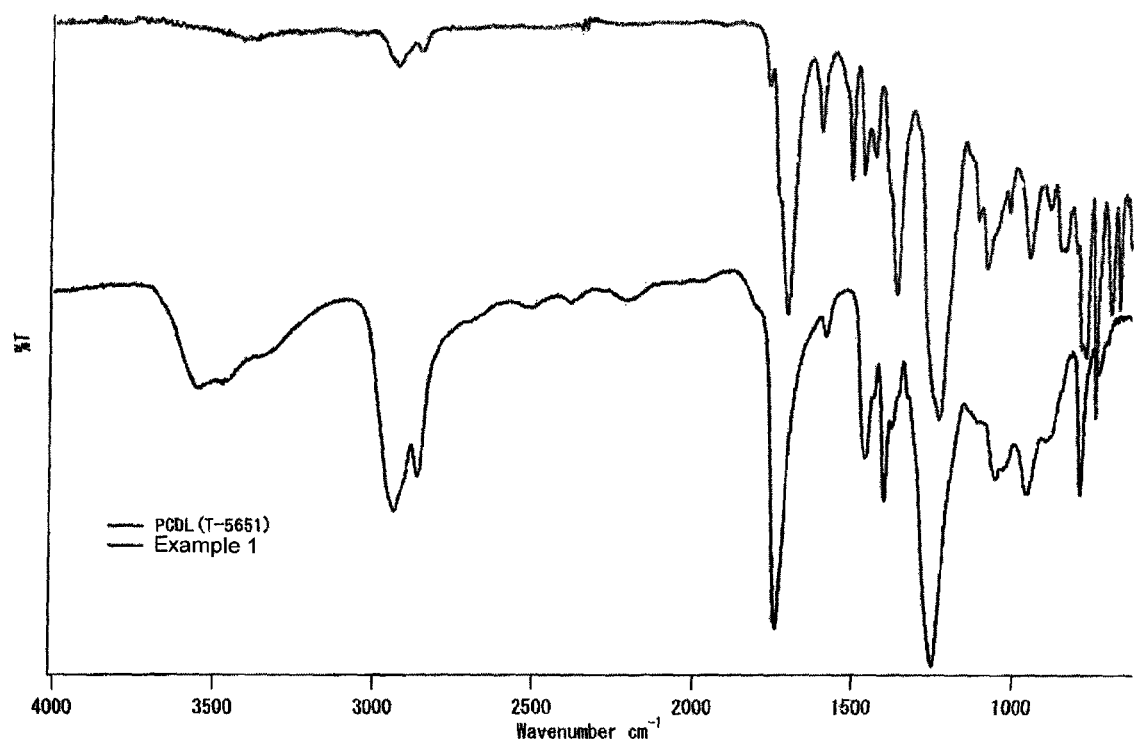

MODIFIED POLYIMIDE AND METHOD FOR PRODUCING MODIFIED POLYIMIDE

TECHNICAL FIELD

The present invention relates to a method of producing a modified polyimide, a modified polyimide and use thereof.

BACKGROUND ART

Flexible printed circuit boards (hereinafter, referred to as "FPC") are often provided with a protective film (coverlay film) on the outer surface thereof for protection of the wiring (copper foil pattern and the like). Further, as an insulating protective film of flexible circuit boards and the like, polyimide resin, polyamideimide resin, polyurethane resin, epoxy resin and the like are employed. In recent years, there is a demand for a protective film having superior heat resistance and various protective films made of polyimide having superior heat resistance have been proposed. In such resin components, polysiloxane, polycarbonate, polybutadiene, polyester or the like is introduced as a flexible component, so that characteristics such as flexibility, bending resistance, low warping and the like are imparted to the resulting cured film.

In Patent Documents 1 and 2, compositions comprising a siloxane-modified polyimide derived from diaminopolysiloxane are disclosed. The siloxane-modified polyimide has excellent heat resistance and electric insulation property and is also excellent in low warping because of its low elasticity. Yet, there are also problems in that the surface of the cured film does not have sufficient adhesion due to the polysiloxane component and that cyclic siloxane is generated and released during high-temperature heating.

In Patent Document 3, a composition comprising a polycarbonate-modified polyamideimide resin is disclosed. This composition is excellent in low warping and the problems of insufficient adhesion of the cured film surface and generation of cyclic siloxane were improved therein. Yet, with the polyamideimide resin alone, the chemical resistance is still low; therefore, the composition needs to be thermally cured with an epoxy and there is a problem of storage stability due to addition of the epoxy. Further, the cured film also has a problem of moisture absorption due to the presence of amide bonds.

Patent Documents 4 and 5 disclose compositions comprising a polycarbonate-modified polyimide resin and Patent Document 6 discloses a composition comprising a polyimide resin modified with polycarbonate and polybutadiene. Thereamong, in Patent Document 4, a modified polyimide resin was obtained by reacting an isocyanate-terminated polycarbonate, aromatic isocyanate and tetracarboxylic dianhydride. However, there are problems in that the types of available aromatic isocyanates are limited and that the chemical resistance of the resin tends to be lowered when the resin is solubilized, so that it is still required to impart with thermosetting property to the resin using an epoxy. In Patent Document 5, in order to easily obtain a soluble modified polyimide, a modified polyimide was prepared by reacting a polycarbonate diol, hydroxyl group-terminated imide oligomer and diisocyanate compound. However, because of the problem in the solubility of the hydroxyl group-terminated imide oligomer, practically, the structure between the hydroxyl group and imide group must be an aliphatic structure, so that the heat resistance tends to be low. Further, the resin composition disclosed in Patent Document 6 is also a thermosetting type as in the case of those disclosed in Patent Documents 4 and 5.

PRIOR ART DOCUMENTS

Patent Documents

[Patent Document 1] JP H7-304950A
[Patent Document 2] JP H8-333455A
[Patent Document 3] JP 2003-138015A
[Patent Document 4] JP 2002-145981A
[Patent Document 5] JP 2006-307183A
[Patent Document 6] JP 2007-246632A

SUMMARY OF THE INVENTION

Problems to be Solved by the Invention

An object of the present invention is to provide a method of producing a modified polyimide comprising a polycarbonate, which modified polyimide has excellent electric properties and adhesion as well as excellent heat resistance, flexibility, bending property, low warping, chemical resistance and storage stability; and the modified polyimide. Another object of the present invention is to provide a composition comprising the modified polyimide and used thereof.

Means for Solving the Problems

The present inventors intensively studied to discover that, according to a method in which an isocyanate-terminated oligomer comprising a polycarbonate component having excellent flexibility is allowed to react with a tetracarboxylic dianhydride to synthesize a tetracarboxylic dianhydride oligomer comprising the polycarbonate component and the thus obtained oligomer is then further allowed to react with an aromatic diamine and aromatic tetracarboxylic dianhydride to produce a polyimide block copolymer, an excellent modified polyimide satisfying all of the above-described various characteristics can be produced by appropriately selecting the aromatic diamine from a wide range of selectable aromatic diamines. Further, the present inventors actually utilized this production method to successfully produce a modified polyimide satisfying all of the above-described various characteristics, thereby completing the present invention.

That is, the present invention provides a method of producing a modified polyimide, which comprises a first step in which an isocyanate-terminated oligomer represented by Formula (I):

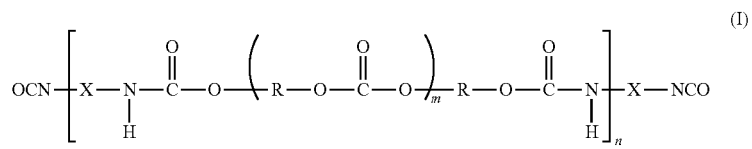

(wherein each R independently represents a $C_1$-$C_{18}$ alkylene group; each X independently represents a $C_1$-$C_{18}$ alkylene group or arylene group, or $C_1$-$C_{18}$ alkylene groups bound through an ether bond(s), ester bond(s), urethane bond(s) or amide bond(s); and m and n represent an integer of 1 to 20) and a tetracarboxylic dianhydride represented by Formula (II):

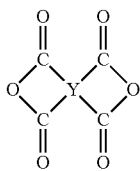

(wherein Y represents a tetravalent aromatic group) are allowed to react to synthesize a tetracarboxylic dianhydride oligomer represented by Formula (III):

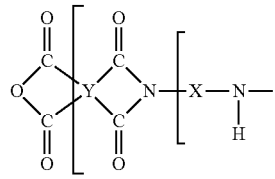

(wherein R has the same meaning as in the above-described Formula (I); X has the same meaning as in the above-described Formula (I); Y has the same meaning as in the above-described Formula (II); m and n have the same meanings as in the above-described Formula (I); and p represents an integer of 1 to 20);
and a second step in which the thus synthesized tetracarboxylic dianhydride oligomer is allowed to react with an aromatic diamine represented by Formula (IV):

$$NH_2\text{-A-}NH_2 \quad (IV)$$

(wherein A represents a divalent aromatic group)
and a tetracarboxylic dianhydride represented by Formula (II'):

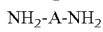

(II')

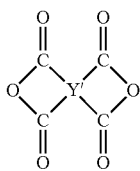

(wherein Y' represents a tetravalent aromatic group) to synthesize a modified polyimide which has a polycarbonate structure and aromatic polyimide structure, the modified polyimide being represented by Formula (V):

(wherein R has the same meaning as in the above-described Formula (I); X has the same meaning as in the above-described Formula (I); Y has the same meaning as in the above-described Formula (II); m and n have the same meanings as in the above-described Formula (I); p has the same meaning as in the above-described Formula (III); A has the same meaning as in the above-described Formula (IV); Y' has the same meaning as in the above-described Formula (II'); and q represents an integer of 1 to 20),

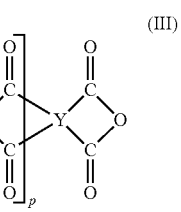

wherein the weight ratio of the flexible structures, so-called repeating units, whose number is represented by the n in the above-described Formula (V), to the above-described modified polyimide represented by the above-described Formula (V) is 0.3 to 0.7 (with the proviso that the weight of X is excluded when X is aromatic).

Further, the present invention provides a modified polyimide having a structure represented by Formula (V):

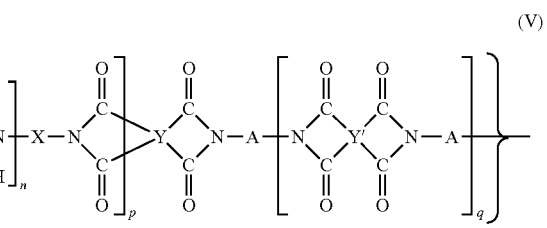

[wherein each R independently represents a $C_1$-$C_{18}$ alkylene group; each X independently represents a $C_1$-$C_{18}$ alkylene group or arylene group, or $C_1$-$C_{18}$ alkylene groups bound through an ether bond(s), ester bond(s), urethane bond(s) or amide bond(s); A represents a divalent aromatic group represented by:

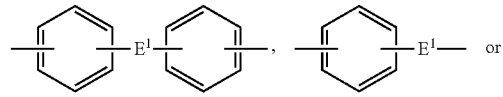

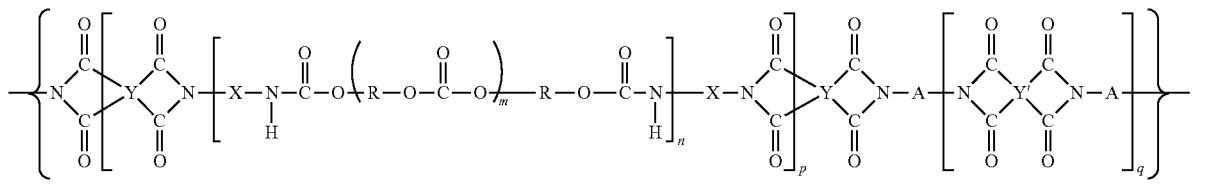

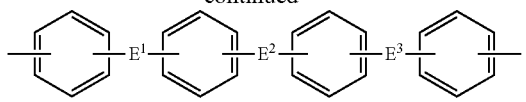

(wherein $E^1$, $E^2$ and $E^3$ each independently represent a direct bond, —O—, —$SO_2$—, —S— or —$C(CH_3)_2$—);
Y and Y' each independently represent a tetravalent aromatic group; and m, n, p and q each independently represent an integer of 1 to 20],
wherein the weight ratio of the flexible structures, so-called repeating units, whose number is represented by the n in the above-described Formula (V), to the above-described modified polyimide represented by the above-described Formula (V) is 0.3 to 0.7 (with the proviso that the weight of X is excluded when X is aromatic).

Further, the present invention provides a modified polyimide resin composition which comprises the above-described modified polyimide according to the present invention in an organic solvent.

Further, the present invention provides a resin film obtained by forming a film of the above-described modified polyimide resin composition according to the present invention and then heating the thus formed film to remove the above-described solvent. Still further, the present invention provides a resin film composed of a cured product of the resin film according to the present invention. Still further, the present invention provides a printed circuit board which is partially or entirely covered with the above-described resin film according to the present invention. Still further, the present invention provides an electronic component comprising the above-described resin film according to the present invention.

Effects of the Invention

By the present invention, a method of producing a polycarbonate-containing modified polyimide; a modified polyimide produced by the method, which has excellent electric properties and adhesion as well as excellent heat resistance, flexibility, bending property, low warping, chemical resistance and storage stability; and a polyimide resin composition comprising the modified polyimide were provided for the first time. A resin film formed from the resin composition according to the present invention can be used as a coating film which has excellent electric properties and adhesion as well as excellent heat resistance, flexibility, bending property, low warping and chemical resistance, so that a highly reliable printed circuit board and electronic component which comprise the resin film were provided.

BRIEF DESCRIPTION OF THE DRAWINGS

FIG. 1 shows the result of IR analysis of a modified polyimide obtained in an Example of the present invention.

MODE FOR CARRYING OUT THE INVENTION

The isocyanate-terminated oligomer used in the production method according to the present invention, which is represented by the above-described Formula (II), can be obtained by allowing a polycarbonate diol represented by Formula (VI):

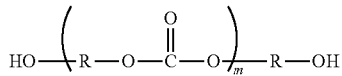

(wherein each R independently represents a $C_1$-$C_{18}$ alkylene group; and m represents an integer of 1 to 20)
to react with a diisocyanate represented by Formula (VII):

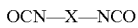 (VII)

(wherein X represents a $C_1$-$C_{18}$ alkylene group or arylene group, or $C_1$-$C_{18}$ alkylene groups bound through an ether bond(s), ester bond(s), urethane bond(s) or amide bond(s)).

In the above-described Formula (VI), each R is independently a $C_1$-$C_{18}$ alkylene group, preferably a $C_2$-$C_8$ alkylene group, and m is an integer of 1 to 20, preferably an integer of 6 to 16. The polycarbonate diol used here, which is represented by the Formula (IV), has a number average molecular weight of preferably 500 to 10,000, more preferably 800 to 5,000. It is difficult to obtain a suitable flexibility when the number average molecular weight is less than 500, while when the average molecular weight is greater than 10,000, the viscosity becomes high, impairing the handling property. Examples of the polycarbonate diol used here include commercially available ones such as DURANOL (trade name) T6001, T5651 and T4691 (all of which are manufactured by Asahi Kasei Chemicals Corporation); and PLACCEL (trade name) CD-210, CD-210PL and CD-210HL (all of which are manufactured by Daicel Chemical Industries, Ltd.). These polycarbonate diols are used individually or in combination of two or more thereof.

Further, the X in the above-described Formula (V) is preferably a $C_1$-$C_{18}$ alkylene group or an arylene group, or $C_1$-$C_{18}$ alkylene groups bound through an ether bond(s), ester bond(s), urethane bond(s) or amide bond(s). Specific examples thereof include aliphatic and alicyclic diisocyanates such as 1,4-tetramethylene diisocyanate, 1,5-pentamethylene diisocyanate, 1,6-hexamethylene diisocyanate, 2,2,4-trimethyl-1,6-hexamethylene diisocyanate, isophorone diisocyanate, 1,3-bis(isocyanatemethyl)cyclohexane, 1,4-bis(isocyanatemethyl)cyclohexane, 4,4'-dicyclohexylmethane diisocyanate and 3,3'-dimethyl-4,4'-dicyclohexylmethane diisocyanate; and aromatic diisocyanates such as tolylene-2,4-diisocyanate, tolylene-2,5-diisocyanate, tolylene-2,6-diisocyanate, 4,4'-diphenylmethane diisocyanate, 1,5-naphthalene diisocyanate, 2,6-naphthalene diisocyanate and 2,2-bis(4-phenoxyphenyl)propane-4,4'-diisocyanate. In addition, the X may also be a group in which two or more $C_1$-$C_{18}$ alkylene groups are bound through an ether bond(s), ester bond(s), urethane bond(s) or amide bond(s), and a group in which two or more (preferably 2 to 5) alkylene groups contained in the above-described various diisocyanates are bound by an ether bond(s), ester bond(s), urethane bond(s) or amide bond(s) is also preferred. Specific examples of urethane bond-type include modified products having an isocyanate terminal, such as DURANATE (trade name) D101 and D201, both of which are manufactured by Asahi Kasei Chemicals Corporation. When an aromatic diisocyanate is used, as compared to a case where an aliphatic diisocyanate is used, the modified polyimide resin tends to have a higher heat resistance and higher elastic modulus. Further, in order to improve the solvent resistance, a trivalent or higher-valent isocyanate may also be used in such an amount which does not cause gelation, and examples of such isocyanate include trivalent isocyanate products such as DURANATE (trade name) TPA-100 manufactured by Asahi Kasei Chemicals Corporation. Here, in order to avoid changes with time, the above-described isocyanate compounds may also be made into a block compound with an alcohol, phenol, oxime or the like. These diisocyanates are used individually or in combination of two or more thereof.

The compounding ratio of the above-described carbonate diol represented by the Formula (VI) and the above-described diisocyanate represented by the Formula (VII) (the number of isocyanate group/the number of hydroxyl group) is preferably 1.1 to 2.5. When the number of isocyanate group/the number of hydroxyl group is lower than 1.1, the viscosity becomes high, which is problematic at the time of imidization in the later step. On the other hand, when the number of isocyanate group/the number of hydroxyl group is higher than 2.5, reaction between isocyanates simply becomes more likely to occur, which is meaningless.

The reaction can be carried out either in the absence of solvent or in the presence of an organic solvent. It is preferred that the reaction temperature be 40° C. to 180° C. The reaction time can be selected as appropriate depending on the reaction conditions, scale and the like, and it is, for example, about 30 minutes to 2 hours.

In this manner, the isocyanate-terminated oligomer represented by the Formula (I) is obtained. In the Formula (I), n is an integer of 1 to 20, preferably an integer of 1 to 4, and the other symbols are as defined in the above.

By allowing the thus obtained isocyanate-terminated oligomer represented by the Formula (I) to react with a tetracarboxylic dianhydride represented by the Formula (II):

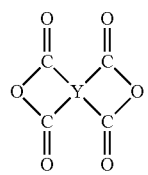

(II)

(wherein Y represents a tetravalent aromatic group), a tetracarboxylic dianhydride oligomer represented by the Formula (III) is synthesized. Here, the tetracarboxylic dianhydride represented by the Formula (II) is not particularly restricted; however, specific examples thereof include aromatic tetracarboxylic dianhydrides such as pyromellitic dianhydride, 3,3',4,4'-biphenyltetracarboxylic dianhydride, bis(3,4-dicarboxyphenyl)ether dianhydride, 3,3',4,4'-benzophenone tetracarboxylic dianhydride, 3,3',4,4'-biphenylsulfone tetracarboxylic dianhydride, 2,2-bis(3,4-dicarboxyphenyl)propane dianhydride, 4,4'-(4,4'-isopropylidenediphenoxy) bisphthalic dianhydride, 2,2-bis(3,4-dicarboxyphenyl) hexafluoropropane dianhydride, ethylenebis(trimellitate) dianhydride and p-phenylenebis(trimellitic monoester anhydride); and alicyclic tetracarboxylic dianhydrides such as 1,2,4,5-cyclohexane tetracarboxylic dianhydride, 3,3',4,4'-bicyclohexyl tetracarboxylic dianhydride and bicyclo[2.2.2] oct-7-ene-2,3,5,6-tetracarboxylic dianhydride. These tetracarboxylic dianhydrides are used individually or in combination of two or more thereof.

The compounding ratio of the isocyanate-terminated oligomer represented by the Formula (I) and the tetracarboxylic dianhydride represented by the Formula (II) (carboxylic anhydride group/isocyanate group) is preferably not lower than 1.1. When the ratio (carboxylic anhydride group/isocyanate group) is lower than 1.1, the viscosity becomes high, which is problematic at the time of imidization in the later step.

It is preferred that the reaction temperature be 80° C. to 200° C. The reaction time can be selected as appropriate depending on the reaction conditions, scale and the like, and it is, for example, 45 minutes to 3 hours. The tetracarboxylic dianhydride oligomer obtained in this manner can also be isolated using a poor solvent such as methanol; however, since this process is not economically efficient, it is most preferred to carry out the subsequent second step without isolating the tetracarboxylic dianhydride oligomer.

The tetracarboxylic dianhydride oligomer obtained in this manner, which is represented by the Formula (III) (wherein R, X, Y, m and n are as defined in the above; and p represents an integer of 1 to 20, preferably an integer of 1 to 8) has a number average molecular weight of preferably 500 to 10,000, more preferably 1,000 to 9,000. When the number average molecular weight is less than 500, the warping property tends to be deteriorated, while when it is greater than 10,000, the reactivity of the terminal acid anhydride tends to be decreased, making it difficult to introduce the oligomer into the polyimide main chain.

In the subsequent second step, by dissolving in an organic solvent the tetracarboxylic dianhydride oligomer obtained in the above-described manner, which is represented by the Formula (III), an aromatic diamine represented by the above-described Formula (IV) and a tetracarboxylic dianhydride represented by the above-described Formula (II') to perform direct imidization, a polycarbonate diol-modified polyimide represented by the above-described Formula (V) can be produced. As the mixing ratio of the tetracarboxylic dianhydride (the total of the tetracarboxylic dianhydride oligomer represented by the above-described Formula (III) and the tetracarboxylic dianhydride represented by the above-described Formula (II')) and diamine, it is preferred that the total amount of diamine be 0.9 to 1.1 mol, with respect to the total amount of acid dianhydride of 1 mol. As the synthesis method, any known method may be employed, and chemical imidization with a catalyst such as an acetic anhydride/triethylamine-based catalyst or valerolactone/pyridine-based catalyst can be suitably employed. The reaction temperature is normally 80° C. to 220° C., preferably 120° C. to 200° C. The reaction time can be selected as appropriate depending on the reaction conditions, scale and the like, and it is, for example, 1 hour to 6 hours.

The diamine compound used in the second step is not particularly restricted; however, since characteristics such as flexibility, bending property and low warping are provided by the polycarbonate structure, an aromatic diamine having excellent heat resistance and chemical resistance is used. Here, by appropriately selecting the aromatic diamine to be used, the resulting modified polyimide can have a variety of preferable characteristics. Specific examples of the aromatic diamine include m-phenylenediamine, p-phenylenediamine, 2,4-diaminotoluene, 3,5-diaminobenzoic acid, 2,6-diaminopyridine, 2,6-diamino-4-methylpyridine, 4,4'-diamino-2, 2'-dimethyl-1,1'-biphenyl, 4,4'-diamino-3,3'-dimethyl-1,1'-biphenyl, 4,4'-diamino-3,3'-dihydroxy-1,1'-biphenyl, 3,4'-diaminodiphenylether, 4,4'-diaminodiphenylether, 4,4'-diaminodiphenylmethane, 4,4'-diaminodiphenylmethane-3, 3'-dicarboxylic acid, 3,3'-diaminodiphenylsulfone, 4,4'-diaminodiphenylsulfone, 3,3'-diamino-4,4'-dihydroxydiphenylsulfone, 4,4'-diaminodiphenyl sulfide, 1,3-bis(3-aminophenoxy)benzene, 1,3-bis(4-aminophenoxy)benzene, 1,4-bis(4-aminophenoxy)benzene, 2,2-bis(4-aminophenyl)propane, α,α-bis(4-aminophenyl)-1,3-diisopropylbenzene, α,α-bis(4-aminophenyl)-1,4-diisopropylbenzene, [3-(4-aminobenzoyl)oxyphenyl]-4-aminobenzoate, [4-(4-aminobenzoyl)oxyphenyl]-4-aminobenzoate, 4,4'-bis(4-aminophenoxy)biphenyl, 2,2-bis[4-(4-aminophenoxy)phenyl]propane, bis[4-(3-aminophenoxy)phenyl]sulfone, bis[4-(4-aminophenoxy) phenyl]sulfone, 4,4'-(9-fluorenylidene)dianiline, 5(6)-amino-1-(4-aminophenyl)-1,3,3-trimethylindane, 4,4'-diamino-2,2'-di-trifluoromethyl-1,1'-biphenyl, 2,2-bis(4-aminophenyl)hexafluoropropane, 2,2-bis[4-(4-aminophenoxy)phenyl]hexafluoropropane, 2,2-bis(3-amino-4-methylphenyl)hexafluoropropane and 2,2-bis(3-amino-4-hydroxyphenyl)hexafluoropropane. These diamines are used individually or in combination of two or more thereof.

Among these diamines, the A in the Formula (VI) is preferably one having a structure represented by:

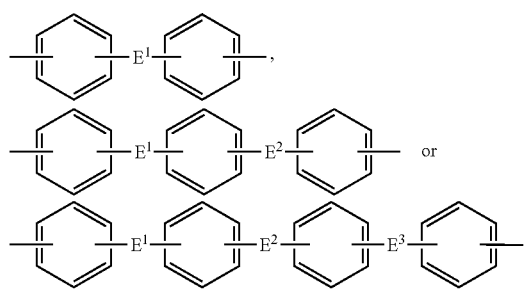

[wherein $E^1$, $E^2$ and $E^3$ each independently represent a direct bond (that is, adjacent benzene rings are directly bound with each other), —O—, —SO$_2$—, —S— or —C(CH$_3$)$_2$—], since such diamine has excellent electric properties and adhesion, as well as excellent heat resistance, flexibility, bending property, low warping, chemical resistance and storage stability.

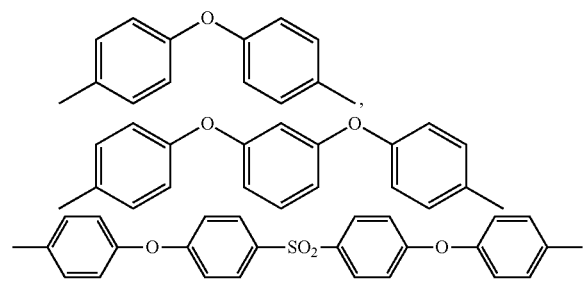

Examples of particular preferred structure include those shown in the above.

Preferred examples of the tetracarboxylic dianhydride represented by the above-described Formula (II') are the same as those of the tetracarboxylic dianhydride represented by the above-described Formula (II). The tetracarboxylic dianhydride represented by the above-described Formula (II') may be the same or different, and these tetracarboxylic dianhydrides are used individually or in combination of two or more thereof.

As the synthetic solvent used in the above-described first and second steps, a non-nitrogen-containing solvent is preferred, and a solvent having a vapor pressure at 25° C. of not higher than 3 mmHg, more preferably not higher than 1 mmHg, can be used. Specific examples of such solvent include γ-butyrolactone, triglyme, tetraglyme, methyl benzoate, ethyl benzoate, ethylcarbitol acetate and butylcarbitol acetate, and these solvents can be used individually or in combination of two or more thereof. Further, in order to adjust the viscosity for preparation of a resin composition, a ketone-based solvent such as cyclohexanone or a carbonate-based solvent such as ethylene carbonate or propylene carbonate may also be used as a diluent.

By the above-described second step, a polycarbonate-modified polyimide represented by the above-described Formula (V) is obtained. In the Formula (V), q represents an integer of 1 to 20, preferably an integer of 1 to 8, and the symbols other than q are as defined in the above.

In the modified polyimide represented by the Formula (V), the weight ratio of the flexible structures, so-called repeating units, whose number is represented by the n, to the weight of the modified polyimide is 0.3 to 0.7, preferably 0.4 to 0.65 (with the proviso that the weight of X is excluded when X is aromatic). When the weight ratio is lower than 0.3, the low warping property cannot be satisfied, while when it is higher than 0.7, the heat resistance and chemical resistance are lowered.

The polyimide resin obtained in this manner has a number average molecular weight of preferably 6,000 to 60,000, more preferably 7,000 to 50,000. The film physical properties such as breaking strength tend to be deteriorated when the number average molecular weight is less than 6,000, while when it is greater than 60,000, it becomes difficult to obtain a paste having suitable workability.

Among those modified polyimides represented by the Formula (I), one in which the A has the above-described structure represented by:

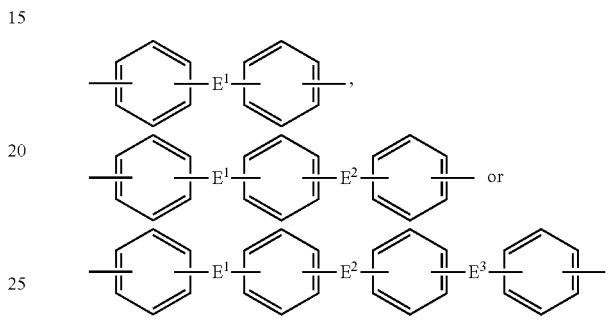

(wherein $E^1$, $E^2$ and $E^3$ each independently represent a direct bond, —O—, —SO$_2$—, —S— or —C(CH$_3$)$_2$—) is a novel substance, and the present invention provides such modified polyimide as well.

Further, the present invention also provides a modified polyimide resin composition which comprises the modified polyimide in an organic solvent. Here, as the organic solvent, a solvent used as synthetic solvent in the above-described production method is preferably employed as is; therefore, as described in the above, a non-nitrogen-containing solvent is preferred. Further, the modified polyimide resin content in the composition is preferably 10 to 50% by weight.

In the modified polyimide resin composition, although the modified polyimide according to the present invention provides satisfactory low warping, with the resin alone, there is still an unresolved problem with respect to the flame retardancy. Therefore, for those applications requiring flame retardancy, it is preferred that the composition comprise a non-halogen-based flame retardant in an amount of 1 to 20 parts by weight, more preferably 2 to 15 parts by weight, most preferably 2 to 10 parts by weight, with respect to 100 parts by weight of the modified polyimide resin. Examples of the non-halogen-based flame retardant include hydrate flame retardants such as aluminum hydroxide and magnesium hydroxide; inorganic flame retardants such as guanidine compounds; melamine-based flame retardants such as melamine cyanurate; and phosphorus-based flame retardants such as triphenyl phosphate and cyclic phenoxyphosphazene, and a melamine-based flame retardant or a phosphorus-based flame retardant, which is strong against both an acid and alkali, can be particularly suitably used. Further, a metal hydroxide or metal salt whose surface is treated with a phosphate-based surfactant can be most suitably used. By using such surface-treated magnesium hydroxide or aluminum diethylphosphinate, not only a problem associated with deterioration of the polyimide film surface in gold plating can be prevented (that is, a high resistance against an acid treatment), but also deterioration in electroless gold plating can be prevented, without impairing the printing properties and flame retardancy.

The phosphorus compound is not particularly restricted; however, it is preferably a phosphate compound or phosphazene compound. Further, use of a phosphate compound and phosphazene compound in combination is more preferred since it can improve the flexibility without impairing the flame retardancy. Specific examples of the phosphate compound include tributyl phosphate, tris(2-ethylhexyl)phosphate, tris(butoxyethyl)phosphate, tricresyl phosphate, trixylenyl phosphate, 2-ethylhexyldiphenyl phosphate, dicresyl-2, 6-xylenyl phosphate, and CR-733S, CR-741, CR747 and PX-200 that are manufactured by Daihachi Chemical Industry Co., Ltd. Specific examples of the phosphazene compound include SPH-100 and SPB-100 that are manufactured by Otsuka Chemical Co., Ltd. These phosphate compounds and phosphazene compounds may also be used individually or in combination of two or more thereof.

In the modified polyimide composition, the content of the phosphorus compound is most preferably 2 to 10% by weight. When the content of the phosphorus compound is less than 2% by weight, the effect of flame retardancy cannot be obtained, while when it is higher than 10% by weight, the outer appearance of the resulting cured film may be deteriorated due to breed-out.

Further, in order to improve the pattern accuracy in coating done by screen printing or the like, organic and/or inorganic particles may be added as a sagging inhibitor. Representative inorganic fillers used in the present invention include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO.TiO_2$), barium carbonate ($BaCO_3$), lead titanate ($PbO.TiO_2$), lead zirconate titanate (PZT), lead lanthanum zirconate titanate (PLZT), gallium oxide ($Ga_2O_3$), spinel ($MgO.Al_2O_3$), mullite ($3Al_2O_3.2SiO_2$), cordierite ($2MgO.2Al_2O_3/5SiO_2$), talc ($3MgO.4SiO_2.H_2O$), aluminum titanate ($TiO_2$—$Al_2O_3$), yttria-containing zirconia ($Y_2O_3$—$ZrO_2$), barium silicate ($BaO.8SiO_2$), boron nitride (BN), calcium carbonate ($CaCO_3$), calcium sulfate ($CaSO_4$), zinc oxide (ZnO), magnesium titanate ($MgO.TiO_2$) and barium sulfate ($BaSO_4$). Organic bentonite, carbon (C) and the like can be used, and these fillers may also be used individually or in combination of two or more thereof.

Examples of the inorganic particle added in the modified polyimide composition according to the present invention include amorphous silica having an average particle size of 0.01 to 0.03 μm; and spherical silica, alumina and titania, which have a particle size of 0.1 to 5.0 μm. Further, in order to improve the storage stability or the like, it is more preferred to use an inorganic filler whose surface is treated with a trimethylsilylation agent or the like. In addition, examples of the organic filler include polyamide resin particles, polyimide resin particles and epoxy resin particles. It is preferred that these fillers be added in an amount of 1 to 25 parts by weight with respect to 100 parts by weight of the polyimide resin. When the amount is less than 1 part by weight, the sagging-inhibiting effect cannot be sufficiently attained, while when the amount is greater than 25 parts by weight, the adhesion tends to be lowered. Here, the method of dispersing the filler in the modified polyimide resin is not particularly restricted as long as it can attain uniform dispersion and mixing by kneading the mixture with stirring using a dispersion machine such as a raikai mixer, 3-roll mill, ball mill, planetary mixer, disper or homogenizer, and any method capable of sufficiently dispersing the filler may be employed. In the modified polyimide resin composition according to the present invention, it is preferred that the viscosity determined by a rotational viscometer be 15,000 mPa·s to 70,000 Pa·s at 25° C. and that the thixotropy index be not lower than 1.1. When the viscosity is lower than 15,000 mPa·s, the outflow of the ink after printing becomes large and the resulting film tends to be thin. When the viscosity is greater than 70,000 mPa·s, the transfer property of the ink to the substrate is deteriorated and plate-releasing during printing tends to be inferior. Further, when the thixotropy index is lower than 1.1, dragging of the ink is increased and the outflow of the ink after printing becomes large, and the resulting film tends to be thin as well.

Here, the viscosity of the ink was measured using Rheometer RS300 manufactured by Thermo Haake. After adjusting the temperature of the plate (fixed part) to 25±0.1° C., a sample is placed thereon in an amount of 1.0 to 2.0 g. The cone (movable part) is moved to a prescribed position and retained there until the temperature of the resin solution held between the plate and cone reaches 25±0.1° C. Then, the cone starts to be rotated, gradually increasing the rotational speed such that the shearing rate becomes 1 (1/s) in 30 seconds. This rotational speed is maintained and the viscosity is read after one minute. Thereafter, the rotational speed is further increased such that the shearing rate reaches 100 (1/s) from 1 (1/s) in one minute, and the viscosity is read at the shearing rate of 100 (1/s). The thixotropy index (TI value) of the resulting paste is expressed as the ratio of the apparent viscosities $\eta 1/\eta 10$ at a shearing rate of 1 (1/s) and 100 (1/s).

Further, in the modified polyimide resin composition according to the present invention, an additive(s) such as a coloring agent, antifoaming agent, leveling agent and adhesion-imparting agent may be added as required. Examples of the coloring agent include phthalocyanine blue, phthalocyanine green, iodine green, disazo yellow, crystal violet, titanium oxide, carbon black and naphthalene black. The antifoaming agent is used for eliminating foams generated during printing, coating and curing processes, and as the antifoaming agent, an acrylic surfactant, silicone-based surfactant or the like is employed as appropriate. Specific examples of the antifoaming agent include BYK-A501 manufactured by BYK Chemi; DC-1400 manufactured by Dow Corning; and silicone-based antifoaming agents such as SAG-30, FZ-328, FZ-2191, FZ-5609, all of which are manufactured by Nippon Unicar Co., Ltd. The leveling agent is used for eliminating irregularities formed on the film surface during printing and coating. Specifically, it is preferred that a surfactant component be added in an amount of about 100 ppm to about 2% by weight. By adding an acrylic leveling agent, silicone-based leveling agent or the like, foaming is inhibited, so that a smooth coating film can be obtained. Preferably, the leveling agent is non-ionic one which does not contain ionic impurities. Examples of appropriate surfactant include FC-430 manufactured by 3M; BYK-501 manufactured by BYK Chemi; and Y-5187, A-1310, SS-2801 to 2805, all of which are manufactured by Nippon Unicar Co., Ltd. Examples of the adhesion-imparting agent include imidazole compounds, thiazole compounds, triazole compounds, organic aluminum compounds, organic titanium compounds and silane coupling agents.

It is preferred that the composition according to the present invention comprise, with respect to (A) 100 parts by weight of polyimide, (B) 1 to 1,000 parts by weight of a mixed solvent of two or more solvents, (C) 5 to 20 parts by weight of a non-halogen flame retardant, (D) 5 to 20 parts by weight of organic and/or inorganic particles and (E) 0.1 to 3.0 parts by weight of a coloring agent, antifoaming agent, leveling agent and/or adhesion-imparting agent. Further, from the standpoint of ease of handling, it is preferred that the composition according to the present invention have a viscosity of 15,000 to 70,000 mPa·s (25° C.). Here, as (B) a mixed solvent of two or more solvents, a mixture of two or more preferred non-nitrogen-containing solvents described in the above can be preferably used.

The modified polyimide resin composition according to the present invention can be produced by mixing a resin produced in such a manner as represented by the above-described Synthesis Example with the respective components in accordance with a conventional method. The mixing method is not particularly restricted. Some of the components may be mixed first and then the remaining components may be mixed, or all of the components may be mixed at once. Specifically, after mixing the above-described components, a known kneading means such as a kneader, 3-roll mill, beads mill or planetary mixer is used to produce the modified polyimide resin composition according to the present invention.

A dry film can be obtained by coating the modified polyimide resin composition according to the present invention on a substrate or the like to an appropriate thickness using a screen printing method and then heating the resultant to remove the solvent. The heat-drying can preferably be carried out at a temperature of 100 to 140° C. for 30 to 60 minutes. The thus obtained dry film has excellent flexibility when cured and can form a cured film which exhibits satisfactory performance in terms of the heat resistance, electric insulation property, chemical resistance, adhesion with a circuit board and the like. The curing of the dry film can preferably be carried out by heating the dry film at a temperature of 160 to 200° C. for 30 to 60 minutes. Further, since this cured film has excellent flexibility and electric insulation property in particular, curling thereof does not occur even when the film is used on a thin circuit board such as a single-sided FPC board or double-sided FPC; therefore, an insulating protective film having excellent electrical performance and ease of handling as well as good flexibility can be formed. In addition, the composition according to the present invention can also be used as an interlayer insulating resin layer of a multilayer printed circuit board.

The insulating protective film can be formed by, after coating the modified polyimide resin composition to a thickness of 10 to 50 μm on a substrate on which a circuit is formed, drying the resultant at a temperature of 100 to 140° C. for 30 to 60 minutes and then heating at a temperature of 160 to 200° C. for 30 to 60 minutes. The modified polyimide resin composition according to the present invention can be used in a variety of applications, and it is particularly suitably used as an insulating protective film of a printed circuit board in which a variety of characteristics such as thermal properties, adhesion with a substrate, insulation properties, heat resistance, warping property and flexibility are demanded, as well as an interlayer insulating resin layer of a multilayer printed circuit board. Further, the dry film of the modified polyimide resin composition according to the present invention is most suitably applied in electronic components where particularly stringent durability is required.

The present invention will now be described more specifically by way of examples thereof; however, the present invention is not restricted to the following examples. Since a polyimide having a variety of characteristics is obtained by a combination of a polycarbonate diol, diisocyanate compound, tetracarboxylic dianhydride and diamine, the present invention is not restricted to these examples.

EXAMPLES

Synthesis Example 1

To a 2-L three-necked separable flask attached with a stainless steel anchor agitator, a ball condenser equipped with a water separation trap was attached. To the flask, 98.60 g (100 mmol) of DURANOL T5651 (polycarbonate diol manufactured by Asahi Kasei Chemicals Corporation) [molecular weight: 986 (calculated from the hydroxyl group value)], 106.40 g of (200 mmol) of DURANATE D201 (diisocyanate manufactured by Asahi Kasei Chemicals Corporation) [molecular weight: 532 (calculated from the % by weight of isocyanate)] and 186 g of γ-butyrolactone (γBL) were added. After stirring the resulting mixture at 200 rpm for 15 minutes at room temperature under nitrogen atmosphere, the mixture was heated to 140° C. and stirred for 1 hour. Then, 62.04 g (200 mmol) of bis(3,4-dicarboxyphenyl)ether dianhydride (ODPA) and 186 g of γBL were added, and the resultant was allowed to react for 1.5 hours with stirring at 200 rpm at 170° C. After cooling the mixture to room temperature, 29.42 g (100 mmol) of 3,3',4,4'-biphenyltetracarboxylic dianhydride (BPDA), 10.01 g (50 mmol) of 4,4'-diaminodiphenyl ether, 43.85 g (150 mmol) of 1,3-bis(3-aminophenoxy)benzene, 248 g of butylcarbitol acetate, 70 g of toluene, 3.2 g (32 mmol) of γ-valerolactone and 5.0 g (64 mmol) of pyridine were further added, and the resultant was allowed to react for 3 hours with stirring at 200 rpm at 170° C. The refluxed materials were removed from the system to obtain a polyimide solution having a concentration of 35%.

Synthesis Example 2

The same apparatus as in Synthesis Example 1 was used. To the flask, 133.11 g (135 mmol) of DURANOL T5651 (trade name), 45.41 g (270 mmol) of hexamethylene diisocyanate (HDI) and 155 g of γBL were added. After stirring the resulting mixture at 200 rpm for 15 minutes at room temperature under nitrogen atmosphere, the mixture was heated to 140° C. and stirred for 1 hour. Then, 55.84 g (180 mmol) of ODPA and 155 g of γBL were added, and the resultant was allowed to react for 1.5 hours with stirring at 200 rpm at 170° C. After cooling the mixture to room temperature, 39.72 g (135 mmol) of BPDA, 77.85 g (180 mmol) of bis[4-(4-aminophenoxy)phenyl]sulfone (BAPS), 310 g of γBL, 70 g of toluene, 3.2 g (32 mmol) of γ-valerolactone and 5.0 g (64 mmol) of pyridine were further added, and the resultant was allowed to react for 3 hours with stirring at 200 rpm at 170° C. The refluxed materials were removed from the system to obtain a polyimide solution having a concentration of 35%.

Synthesis Example 3

The same apparatus as in Synthesis Example 1 was used. To the flask, 157.76 g (160 mmol) of DURANOL T5651 (trade name), 67.26 g (320 mmol) of 1,5-naphthalene diisocyanate (NDI) and 177 g of γBL were added. After stirring the resulting mixture at 200 rpm for 15 minutes at room temperature under nitrogen atmosphere, the mixture was heated to 140° C. and stirred for 1 hour. Then, 62.04 g (200 mmol) of ODPA and 176 g of γBL were added, and the resultant was allowed to react for 1.5 hours with stirring at 200 rpm at 170° C. After cooling the mixture to room temperature, 5.88 g (20 mmol) of BPDA, 25.95 g (60 mmol) of BAPS, 353 g of γBL, 70 g of toluene, 2.2 g (22 mmol) of γ-valerolactone and 3.5 g (44 mmol) of pyridine were further added, and the resultant was allowed to react for 3.5 hours with stirring at 200 rpm at 170° C. The refluxed materials were removed from the system to obtain a polyimide solution having a concentration of 30%.

Synthesis Comparative Example 1

The same apparatus as in Synthesis Example 1 was used. To the flask, 147.90 g (150 mmol) of DURANOL T5651 (trade name), 50.46 g (300 mmol) of HDI and 210 g of γBL were added. After stirring the resulting mixture at 200 rpm for 15 minutes at room temperature under nitrogen atmosphere, the mixture was heated to 140° C. and stirred for 1 hour. Then, 62.04 g (200 mmol) of ODPA and 210 g of γBL were added, and the resultant was allowed to react for 1.5 hours with stirring at 200 rpm at 170° C. After cooling the mixture to room temperature, 14.71 g (50 mmol) of BPDA, 12.22 g (100 mmol) of 2,4-diaminotoluene, 210 g of γBL, 70 g of toluene, 2.5 g (25 mmol) of γ-valerolactone and 4.0 g (50 mmol) of pyridine were further added, and the resultant was allowed to react for 1.5 hours with stirring at 200 rpm at 170° C. The refluxed materials were removed from the system, and after the completion of the reaction, 210 g of γBL was further added to obtain a polyimide solution having a concentration of 20%.

Synthesis Comparative Example 2

The same apparatus as in Synthesis Example 1 was used. To the flask, 49.30 g (50 mmol) of DURANOL T5651 (trade name), 16.82 g (100 mmol) of HDI and 147 g of γBL were added. After stirring the resulting mixture at 200 rpm for 15 minutes at room temperature under nitrogen atmosphere, the mixture was heated to 140° C. and stirred for 1 hour. Then, 29.42 g (100 mmol) of BPDA and 147 g of γBL were added, and the resultant was allowed to react for 1.5 hours with stirring at 200 rpm at 170° C. After cooling the mixture to room temperature, 62.04 g (200 mmol) of ODPA, 108.12 g (250 mmol) of BAPS, 294 g of γBL, 70 g of toluene, 3.0 g (30 mmol) of γ-valerolactone and 4.8 g (60 mmol) of pyridine were further added, and the resultant was allowed to react for 2 hours with stirring at 200 rpm at 170° C. The refluxed materials were removed from the system to obtain a polyimide solution having a concentration of 30%.

Synthesis Comparative Example 3

The same apparatus as in Synthesis Example 1 was used. To the flask, 118.32 g (120 mmol) of DURANOL T5651 (trade name), 40.37 g (240 mmol) of HDI and 185 g of γBL were added. After stirring the resulting mixture at 200 rpm for 15 minutes at room temperature under nitrogen atmosphere, the mixture was heated to 140° C. and stirred for 1 hour. Then, 111.68 g (360 mmol) of ODPA, 60.06 g (240 mmol) of 4,4'-diphenylmethane diisocyanate and 370 g of γBL were added, and the resultant was allowed to react for 6 hours with stirring at 200 rpm at 170° C. to obtain a polyimide solution having a concentration of 35%.

The structural formulae of the modified polyimides produced in the above-described Synthesis Examples 1 to 3 and Synthesis Comparative Examples 1 to 3 are shown below. Here, R in each structural formula is a group originated from the diisocyanate used in the respective examples. Further, the values of m, n, p and q were as listed below. It should be noted, however, that the values listed below are theoretical average values and, thus, in the actual modified polyimides, each of these values has some distribution.

Synthesis Example 1: m=11, n=1, p=1, q=1
Synthesis Example 2: m=11, n=1, p=3, q=3
Synthesis Example 3: m=11, n=1, p=4, q=1
Synthesis Comparative Example 1: m=11, n=1, p=3, q=1
Synthesis Comparative Example 2: m=11, n=1, p=1, q=4
Synthesis Comparative Example 3: m=11, n=1, p=1, q=1
Here, the modified polyimides of Synthesis Comparative Examples 1 and 2 have a weight ratio of the flexible structure outside the range prescribed in the present invention, and in the modified polyimide of Synthesis Comparative Example 3, the structure of A in the Formula (I) is outside the scope of the present invention.

Synthesis Example 1

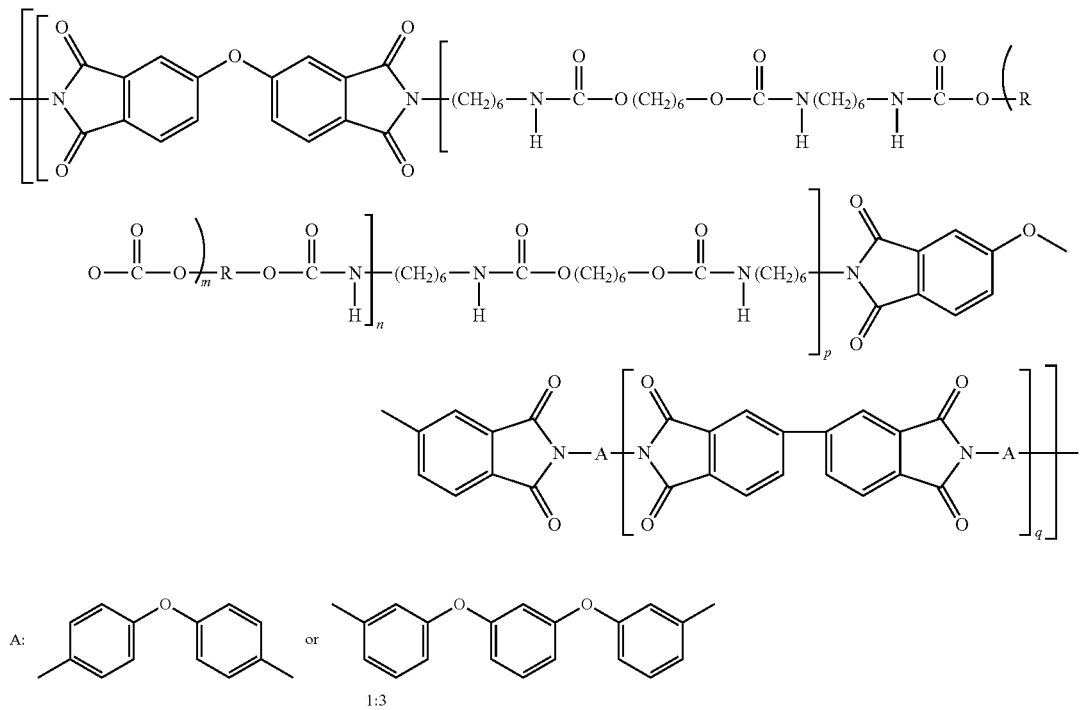

Synthesis Example 2

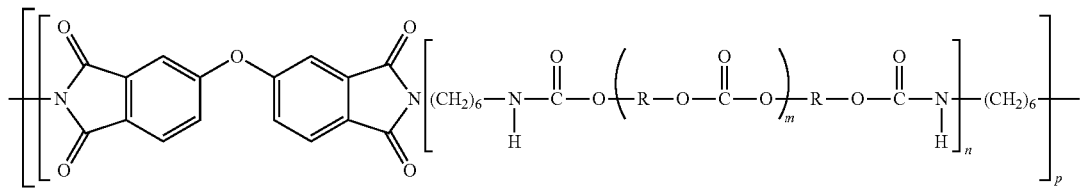

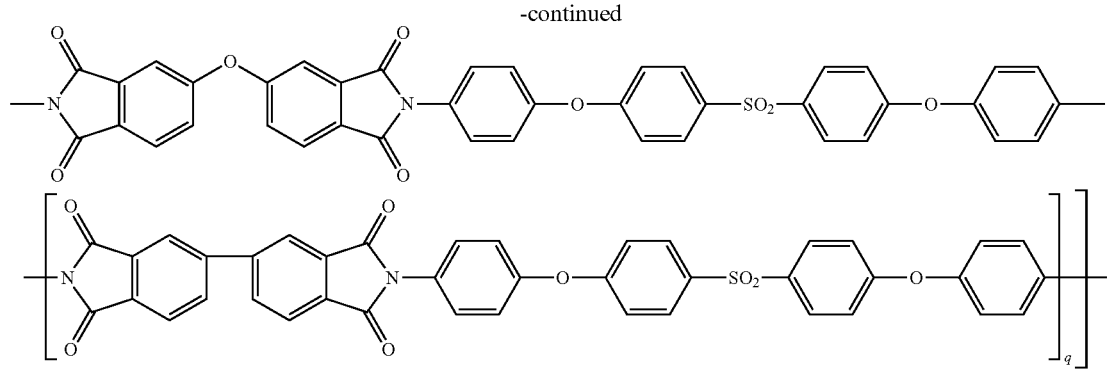
Synthesis Example 3
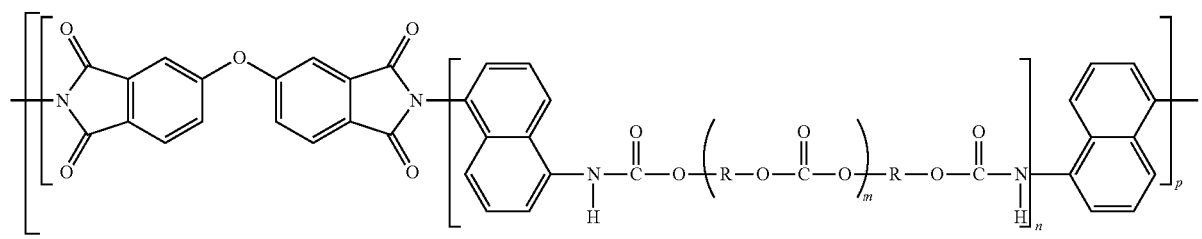
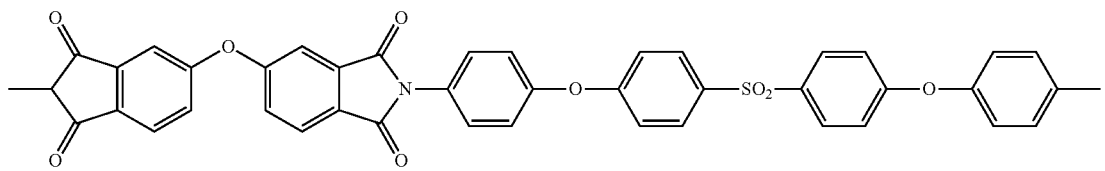
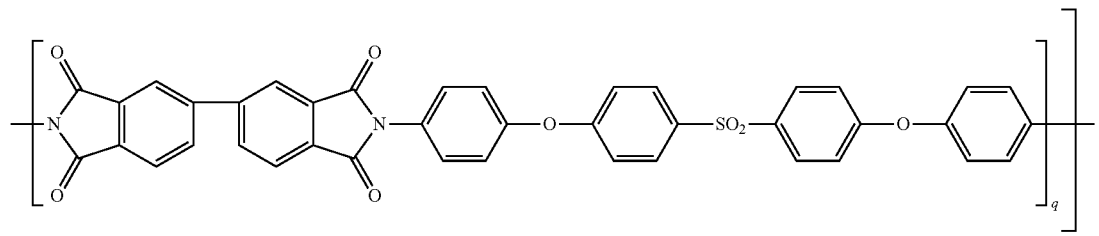
Synthesis Comparative Example 1
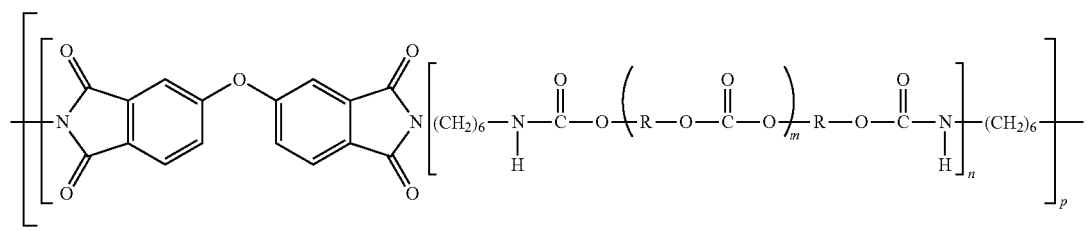

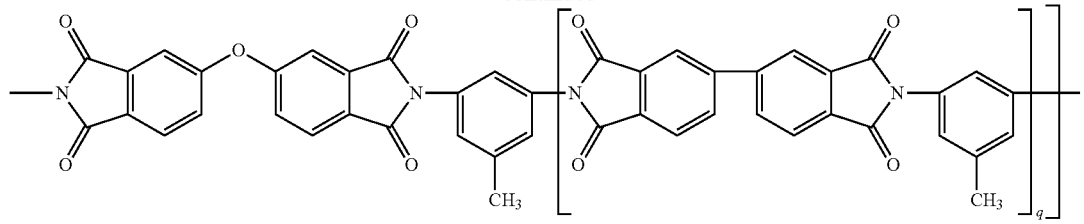

Synthesis Comparative Example 2

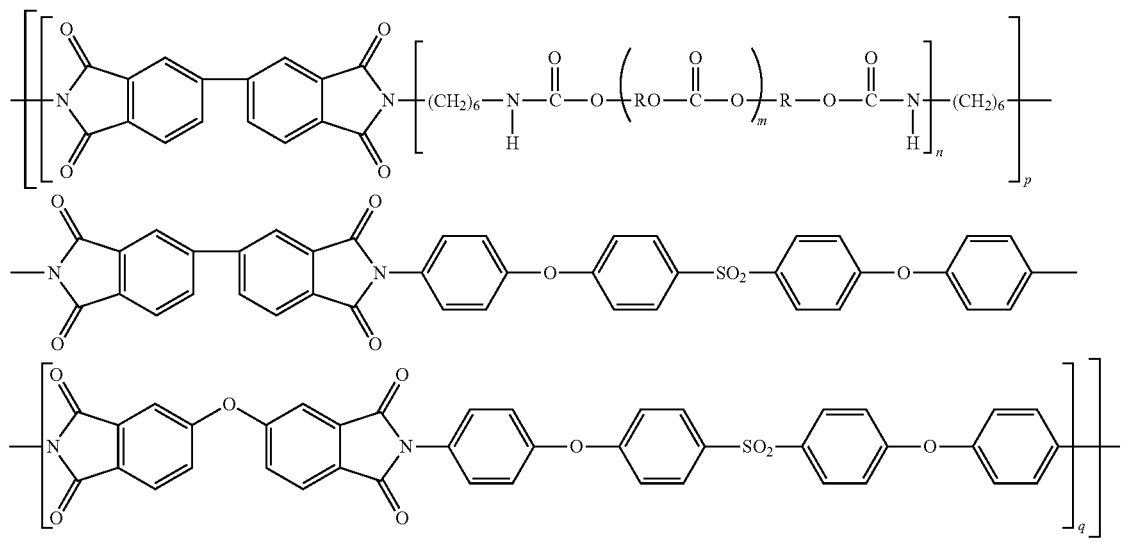

Synthesis Comparative Example 3

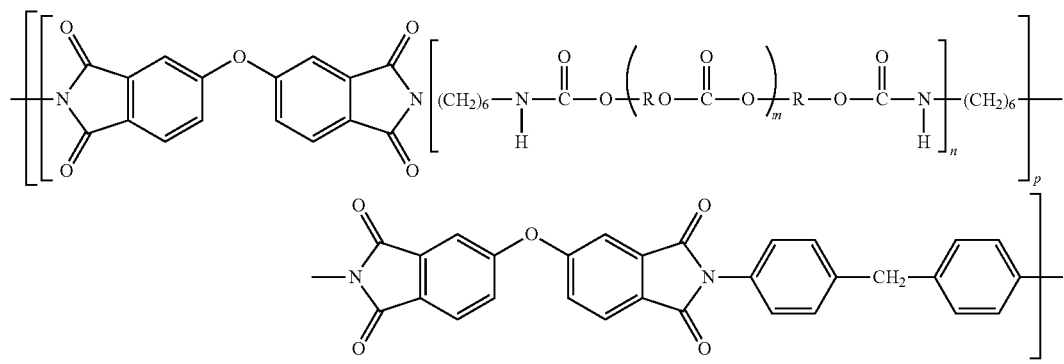

Further, the result of IR analysis of the modified polyimide obtained in Synthesis Example 1 is shown in FIG. 1. In FIG. 1, the spectrum of the T-5651 represents the result of IR analysis of the above-described DURANOL T-5651 (trade name), which is polycarbonate diol, and it is understood that a polycarbonate structure is introduced therein.

Test samples were obtained from those modified polyimide resin compositions which were obtained in the above-described Synthesis Examples and Synthesis Comparative Examples and have a polycarbonate structure. The test samples were subjected to measurements of the following items and the results thereof are shown in Table 1 below.

(a) Molecular Weight: The number average molecular weight (Mn) of the obtained modified polyimide resins was measured by gel permeation chromatography (GPC: HLC-8220GPC manufactured by Tosoh Corporation). TSKgel GMHHR-H manufactured by Tosoh Corporation was used as the column and a mixture obtained by dissolving LiBr in DMF at a concentration of 0.1N was used as the carrier solvent. The molecular weight was calculated in terms of standard polystyrene (TSK standard polystyrene).

(b) Thermal Property: The thermal decomposition initiation temperature of the obtained modified polyimide resins was measured by a DuPont 951 thermogravimeter.

(c) Mechanical Properties: For measuring the mechanical properties of the obtained modified polyimide resins and the like, each of the obtained modified polyimide resins was coated on a copper foil F2-WS (18 μm) manufactured by Furukawa Circuit Foil Co., Ltd. by screen printing to a film thickness after drying of 15±2 μm, and the resulting thin film was dried and heat-treated at 120° C. for 60 minutes and then at 180° C. for 30 minutes. The copper foil was then etched away to prepare a modified polyimide resin film. For the thus obtained modified polyimide resin films, the breaking strength, elongation and initial elastic modulus were measured using a universal tensile tester (Tensilon UTM-11-20, manufactured by Orientec Co., Ltd.).

(d) Warping Property: For warping test, each of the obtained modified polyimide resins was coated on a 25 μm-thick aromatic polyimide film (EN-25, manufactured by DuPont) to a thickness after drying of 15±2 μm, and the resultant was dried at 120° C. for 60 minutes and then at 180° C. for 30 minutes to prepare a modified polyimide resin film. The warpage thereof was determined by measuring the heights from the bottom of the four square corners and taking an average of the measured values. The symbols "⊚", "○" and "Δ" were assigned when the warpage was measured to be not larger than 1 mm, not larger than 10 mm and not smaller than 10 mm, respectively, and when the warpage was too large to be measured, the symbol "x" was assigned.

(e) Chemical Resistance: Samples for the evaluation of the chemical resistance were prepared in the same manner as those samples for the measurement of mechanical properties, except that the copper foil was not etched. The examined chemicals were 1N aqueous sodium hydroxide solution and an organic solvent, methyl ethyl ketone. The symbol "⊚" was assigned when the film had a glossy surface and did not attain a decrease in the film thickness. The symbols "○" and "Δ" were assigned when the decrease in the film thickness was not greater than 0.1 μm and 0.2 to 0.9 μm, respectively, and when the film lost its glossiness or the film thickness decreased by not less than 1.0 μm, the symbol "x" was assigned.

polyimide resin composition. For the thus obtained flame-retardant modified polyimide resin compositions, the following items were evaluated and the results thereof are shown in Table 2.

Bending Property

The modified polyimide compositions were each coated on a substrate by screen printing using a 165-3D mesh stainless steel plate and the resultants were heated in a hot air oven at 120° C. for 60 minutes and then at 180° C. for 30 minutes. As the substrate, a copper foil F2-WS (18 μm) manufactured by Furukawa Circuit Foil Co., Ltd. was used. The thus obtained polyimide films were bent at an angle of 180° with the coated side being bent toward outside, and the presence or absence of breaking was judged by visual observation. The judging criteria were as follows.

○: No breakage of the dry film
x: Presence of breakage of the dry film or occurrence of cracking Solder Heat Resistance In accordance with the test method of JIS C-6481, each of the thus obtained flame-retardant modified polyimide compositions was coated on a substrate by screen printing using a 165-3D mesh stainless steel plate and the resultant was heated in a hot air oven at 120° C. for 60 minutes and then at 180° C. for 30 minutes. As the substrate, a printing substrate [ES-PANEX (registered trademark) MC18-25-00FRM, manufactured by Nippon Steel Chemical Co., Ltd.] composed of a copper foil (thickness of 18 μm) laminated on one side of a polyimide film (thickness of 31 μm) was used. The thus obtained test pieces were coated with a rosin-based flux, and after each cycle of being floated in a solder bath at 260° C. for 5 seconds, the films were dried and visually observed. The solder heat resistance was expressed as the maximum number of cycles that were repeated with confirmation of no change in the respective film without any "swelling", "blistering" or "solder penetration".

Flammability

Test pieces used for flammability test were prepared by the following method. A 20 μm-thick dry film of each of the obtained flame-retardant modified polyimide composition was provided on both sides of a 25 μm-thick, 200 mm×50 mm polyimide film (KAPTON 100EN, manufactured by Du

TABLE 1

Physical Properties of the Polyimides

| | Unit | Synthesis Example 1 | Synthesis Example 2 | Synthesis Example 3 | Synthesis Comparative Example 1 | Synthesis Comparative Example 2 | Synthesis Comparative Example 3 |
|---|---|---|---|---|---|---|---|
| Diisocyanate | | D201 | HDI | NDI | HDI | HDI | HDI |
| Weight ratio of flexible structure | % | 61 | 54 | 52 | 73 | 26 | 53 |
| Number average molecular weight (Mn) | | 15,000 | 21,000 | 40,000 | 8,000 | 9,000 | 18,000 |
| Glass transition temperature (Tg) | ° C. | 63 | 122 | 121 | 40 | 183 | 111 |
| Thermal decomposition temperature (reduction of 5% by weight) | ° C. | 301 | 295 | 320 | 296 | 329 | 297 |
| Elongation | % | >200 | >200 | >200 | >200 | 28 | 145 |
| Elastic modulus | GPa | 0.49 | 0.61 | 0.73 | 0.06 | 2.05 | 0.66 |
| Warping property | | ⊚ | ⊚ | ○ | ⊚ | X | Δ |
| Chemical resistance | | ○ | ○ | ○ | Δ | ⊚ | Δ |

Examples 1 to 5 and Comparative Examples 1 to 3

The base resin and additive components shown in Table 2 below were kneaded using a planetary mixer manufactured by Primix Corporation to prepare a flame-retardant modified Pont-Toray Co., Ltd.) to prepare a test piece. The flammability characteristics were evaluated by a method in accordance with the Test for Flammability of Plastic Materials (94UL-VTM) of Underwriters Laboratories Inc. U.S.A. (hereinafter, abbreviated as "UL").

The "VTM" and "NOT" abbreviations in Table 1 were assigned based on the following criteria.
VTM-0: Rating which satisfies all of the following requirements.
(1) None of the test pieces flame for more than 10 seconds after termination of each flame contact.
(2) When five test pieces of one set were contacted with a flame for a total of 10 times, the combined flaming time does not exceed 50 seconds.
(3) Flaming or glowing combustion does not reach the 125 mm mark.
(4) Flaming droplets do not ignite absorbent cotton.
(5) The combined flaming and glowing combustion time of each test piece after termination of the second flame contact does not exceed 30 seconds.
(6) When only one of the five test pieces in the set fails to satisfy the above requirements or when the combined flaming time is in a range of 51 seconds to 55 seconds, additional five test pieces are tested and all of them satisfy the above (1) to (5).
VTM-1: Rating which satisfies all of the following requirements.
(1) None of the test pieces flame for more than 30 seconds after termination of each flame contact.
(2) When five test pieces of one set were contacted with a flame for a total of 10 times, the combined flaming time does not exceed 250 seconds.
(3) Flaming or glowing combustion does not reach the 125 mm mark.
(4) Flaming droplets do not ignite absorbent cotton.
(5) The combined flaming and glowing combustion time of each test piece after termination of the second flame contact does not exceed 60 seconds.
(6) When only one of the five test pieces in the set fails to satisfy the above requirements or when the combined flaming time is in a range of 251 seconds to 255 seconds, additional five test pieces are tested and all of them satisfy the above (1) to (5).
VTM-2: Rating which satisfies all of the following requirements.
(1) None of the test pieces flame for more than 30 seconds after termination of each flame contact.
(2) When five test pieces of one set were contacted with a flame for a total of 10 times, the combined flaming time does not exceed 250 seconds.
(3) Flaming or glowing combustion does not reach the 125 mm mark.
(4) Flaming droplets may ignite absorbent cotton.
(5) The combined flaming and glowing combustion time of each test piece after termination of the second flame contact does not exceed 60 seconds.
(6) When only one of the five test pieces in the set fails to satisfy the above requirements or when the combined flaming time is in a range of 251 seconds to 255 seconds, additional five test pieces are tested and all of them satisfy the above (1) to (5).
NOT: Rating assigned when the test piece does not qualify for any of the above ratings.

HHBT Resistance

The obtained flame-retardant modified polyimide compositions were each coated on a commercially available IPC-C (comb-shaped pattern) substrate (IPC standard) by screen printing using a 165-3D mesh stainless steel plate and the resultant was heated in a hot air oven at 120° C. for 60 minutes and then at 180° C. for minutes. Under an atmosphere having a temperature of 85° C. and relative humidity of 85%, a direct current of 100 V was applied to the thus obtained test pieces. The intralayer insulation resistance value was measured at 1,000 hours later to evaluate the HHBT resistance. The insulation resistance value was determined by maintaining the application of 100 V DC voltage for one minute and then measuring using an electrical insulation tester with the voltage being applied. The judging criteria were as follows.
◯: Insulation resistance of not lower than $10^8 \Omega$
x: Insulation resistance of lower than $10^8 \Omega$

TABLE 2

| Formulation (part by weight) | | | Example 1 | Example 2 | Example 3 | Example 4 | Example 5 | Comparative Example 1 | Comparative Example 2 | Comparative Example 3 |
|---|---|---|---|---|---|---|---|---|---|---|
| Composition | Polyimide resin | Synthesis Example 1 | 35 | 35 | — | — | — | — | — | — |
| | | Synthesis Example 2 | — | — | 35 | 35 | — | — | — | — |
| | | Synthesis Example 3 | — | — | — | — | 35 | — | — | — |
| | | Synthesis Comparative Example 1 | — | — | — | — | — | 35 | — | — |
| | | Synthesis Comparative Example 2 | — | — | — | — | — | — | 35 | — |
| | | Synthesis Comparative Example 3 | — | — | — | — | — | — | — | 35 |
| | Flame retardant | SN-EA | — | 20 | — | — | — | — | — | — |
| | | MC-5 | — | — | 20 | — | — | 10 | — | — |
| | | Exolit OP 935 | 10 | — | — | 10 | — | — | — | — |
| | | SPB-100 | — | 5 | 10 | 5 | — | — | — | — |
| | Inorganic filler | SOE1 | — | 10 | 10 | 10 | 10 | 10 | 10 | 10 |
| | Coloring agent 4996 | | 3 | 3 | 3 | 3 | 3 | 3 | 3 | 3 |
| | Leveling agent | | 3 | 3 | 3 | 3 | 3 | 3 | 3 | 3 |

TABLE 2-continued

| Formulation (part by weight) | | Example 1 | Example 2 | Example 3 | Example 4 | Example 5 | Comparative Example 1 | Comparative Example 2 | Comparative Example 3 |
|---|---|---|---|---|---|---|---|---|---|
| Physical properties | Bending resistance (180° bending) | >20 times | >20 times | >20 times | >20 times | >20 times | >20 times | >20 times | >20 times |
| | Solder heat resistance (260° C. × 5 seconds) | 5 times | 5 times | 5 times | 5 times | 5 | 2 times | 10 times | 8 times |
| | Flammability (UL94VTM) | VTM-0 | VTM-0 | VTM-0 | VTM-0 | VTM-0 | NOT | VTM-0 | VTM-0 |
| | HHBT resistance | ○ | ○ | ○ | ○ | ○ | ○ | ○ | ○ |

SN-EA Magnesium hydroxide (manufactured by Tateho Chemical Industries Co., Ltd.): Average secondary particle size 0.9 μm, MC-5 Melamine cyanurate (manufactured by Sakai Chemical Industry Co., Ltd.): Average primary particle size 1 to 5 μm, Exolit OP 935 (manufactured by Clariant): Average secondary particle size 2.0 μm, SPB-100 phosphazene-based flame retardant (manufactured by Otsuka Chemical Co., Ltd.): Average primary particle size 1 to 5 μm, SOE1 Spherical silica (manufactured by Admatechs): Average primary particle size 0.2 μm, Phthalocyanine blue4966 (manufactured by Dainichiseika Color & Chemicals Mfg. Co., Ltd.): Average primary particle size 1 to 5 μm, Evaluation of Printing Properties and Continuous Printing Properties Printing was carried out using a test printing screen (200-3D mesh, made of stainless steel, emulsion thickness of 10 μm, frame size of 550 mm×650 mm) and LS-25GX screen printing machine (manufactured by Newlong Machine Works, Ltd.) under the following printing conditions: squeegee speed of 30 to 80 mm/sec; gap (clearance) of 1.5 mm to 3.0 mm; squeegee angle of 70°; and squeegee pressing amount of 0.3 mm, and the following characteristics were evaluated. For the pattern shape of polyimide protective film, printing properties of a circuit wiring and those of pattern of through holes were examined on a flexible circuit board.

Specifically, the ink was printed over the entire circuit board having a copper wiring pattern with line/space of 30 μm/30 μm, 50 μm/50 μm, 100 μm/100 μm and 200 μm/200 μm, and leveling was performed at room temperature for 5 to 10 minutes. After heating the resultant in a hot air oven at 120° C. for 60 minutes and then at 180° C. for 30 minutes to dry the organic solvent component, whether or not the ink was embedded between spaces was examined. Further, circuit boards having a circular pattern shape (diameters of 100 μm and 200 μm) or a square pattern shape (100 μm×100 μm and 200 μm×200 μm), in which each pattern was arranged in 10 rows×10 column at a pitch of 250 μm, were prepared to examine the printing properties of pattern of through holes. Here, 100 shots of printing were continuously performed, and the pattern was sampled at the 10th shot from the start of printing and every 10 shots thereafter until the 100th shot, and after performing leveling and drying under the same conditions as described in the above, the same pattern shapes as described in the above were observed visually and under a light microscope. Evaluations were made on the defect in the embedding property on the circuit wiring, as well as the patterns' "bleeding or sag defect (defect in the bridging condition due to spread of the paste in the pattern width direction and connection thereof with the adjacent pattern)", "void or chipping" and "rolling property (defect in the rotating condition when the paste roll-flows on the screen in a substantially cylindrical shape on the frontside of the moving direction of the squeegee when the squeegee moves). The results of the evaluations are shown in Table 3.

TABLE 3

| | Printing Properties | | | | | | |
|---|---|---|---|---|---|---|---|
| | The number of defects in the embedding property to the circuit wiring and the pattern shape (N = 10) | | | | | | Shape evaluation |
| Example | Embedding Property | Bleeding or sag defect | Blur defect | Void or chipping | Rolling property | Total | Good |
| Example 1 | 0 | 0 | 0 | 0 | ◎ | 0 | Good |
| Example 2 | 0 | 0 | 0 | 0 | ◎ | 0 | Good |
| Example 3 | 0 | 0 | 0 | 0 | ◎ | 0 | Good |
| Example 4 | 0 | 0 | 0 | 0 | ◎ | 0 | Good |
| Example 5 | 0 | 0 | 0 | 0 | ◎ | 0 | Good |
| Comparative Example 1 | 0 | 0 | 0 | 0 | ○ | 0 | Good |
| Comparative Example 2 | 0 | 0 | 0 | 0 | ○ | 0 | Good |
| Comparative Example 3 | 0 | 0 | 0 | 0 | ○ | 0 | Good |

Gold Plating

Gold plating was performed by conventional electrolytic gold plating and electroless gold plating. That is, the gold plating was performed in accordance with the following steps. Specifically, samples were sequentially immersed in the bath of each step and then dried.

Electrolytic Gold Plating Steps:

degreasing treatment (acid or alkaline degreasing), washing with water, acid treatment, washing with water, soft etching, washing with water, pre-dipping treatment (acid treatment), washing with water, electrolytic nickel (Watt bath) plating, washing with water, electrolytic gold (gold potassium cyanide) plating, washing with water, and drying Electroless Gold Plating Steps:

degreasing treatment (acid or alkaline degreasing), washing with water, acid treatment, washing with water, soft etching, washing with water, pre-dipping treatment (acid treatment), catalyzation with palladium chloride, washing with water, electroless nickel plating step (nickel nitrate), washing with water, electroless gold (gold potassium cyanide) plating, washing with water, and drying Evaluation of Laminate Using ESPANEX M (manufactured by Nippon Steel Chemical Co., Ltd.; the insulating layer has a thickness of 25 μm and the conductor layer is the copper foil F2-WS (18 μm)) as substrate of flexible printed circuit board, a comb-shaped circuit board having line/space of 30 μm/30 μm, 50 μm/50 μm, 100 μm/100 μm and 200 μm/200 μm was prepared. The obtained flame-retardant modified polyimide compositions were each partially printed on the thus prepared circuit board, and electrolytic nickel-gold plating or electroless nickel-gold plating was performed on the non-printed part to a nickel thickness of about 3 to 5 μm and a gold thickness of about 0.03 to 0.07 μm. Penetration of the plating into the part which was printed with the ink was verified by micro X-ray fluorescence analysis or cross-sectional observation. The results thereof are shown in Table 4.

TABLE 4

Results of Plating Test

| | Amount of the plating penetrated into the circuit wiring (μm) | | | |
|---|---|---|---|---|
| Example | Electrolytic nickel plating | Electrolytic gold plating | Electroless nickel plating | Electroless gold plating |
| Example 1 | <20 | <20 | <20 | <20 |
| Example 2 | <20 | <20 | <20 | <20 |
| Example 3 | <20 | <20 | <20 | <50 |
| Example 4 | <50 | <20 | <20 | <20 |
| Example 5 | <50 | <50 | <50 | <50 |
| Comparative Example 1 | <100 | <100 | <100 | <100 |
| Comparative Example 2 | <100 | <100 | <100 | <100 |
| Comparative Example 3 | <100 | <100 | <100 | <100 |

INDUSTRIAL APPLICABILITY

According to the present invention, a method of producing a polycarbonate-containing modified polyimide is provided. Further, by this method, a modified polyimide which has excellent electric properties and adhesion as well as excellent heat resistance, flexibility, bending property, low warping, chemical resistance and storage stability, and a polyimide resin composition comprising the modified polyimide are also provided. A resin film formed from the resin composition according to the present invention can be used as a coating film which has excellent electric properties and adhesion as well as excellent heat resistance, flexibility, bending property, low warping and chemical resistance.

The invention claimed is:

1. A method of producing a modified polyimide, comprising a first step in which an isocyanate-terminated oligomer represented by Formula (I):

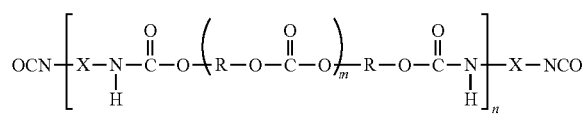

(I)

(wherein each R independently represents a $C_1$-$C_{18}$ alkylene group; each X independently represents a $C_1$-$C_{18}$ alkylene group or arylene group, or $C_1$-$C_{18}$ alkylene groups bound through an ether bond(s), ester bond(s), urethane bond(s) or amide bond(s); and m and n represent an integer of 1 to 20) and a tetracarboxylic dianhydride represented by Formula (II):

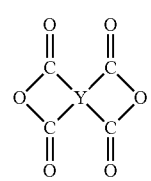

(II)

(wherein Y represents a tetravalent aromatic group) are allowed to react to synthesize a tetracarboxylic dianhydride oligomer represented by Formula (III):

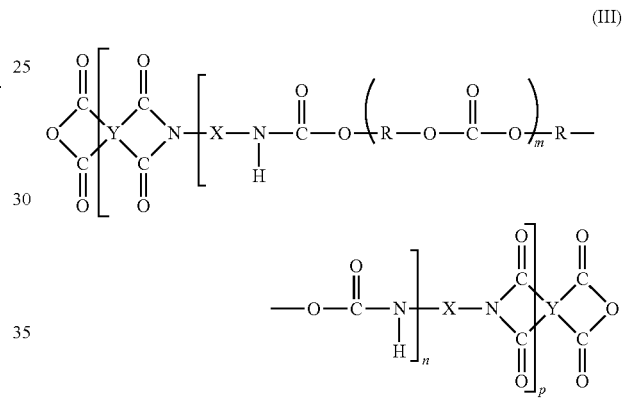

(III)

(wherein R has the same meaning as in said Formula (I); X has the same meaning as in said Formula (I); Y has the same meaning as in said Formula (II); m and n have the same meanings as in said Formula (I); and p represents an integer of 1 to 20); and a second step in which the thus synthesized tetracarboxylic dianhydride oligomer is allowed to react with an aromatic diamine represented by Formula (IV):

$$NH_2\text{-}A\text{-}NH_2 \qquad (IV)$$

(wherein A represents a divalent aromatic group)

and a tetracarboxylic dianhydride represented by Formula (II'):

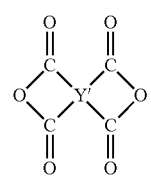

(II')

(wherein Y' represents a tetravalent aromatic group)

to synthesize a modified polyimide which has a polycarbonate structure and aromatic polyimide structure, said modified polyimide being represented by Formula (V):

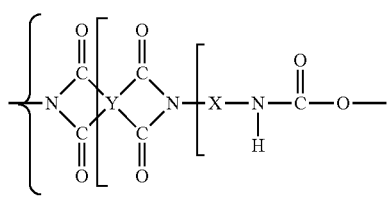

(V)

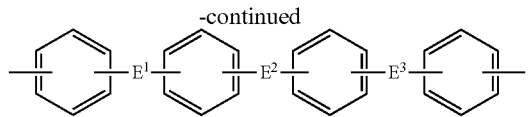

(wherein $E^1$, $E^2$ and $E^3$ each independently represent a direct bond, —O—, —SO$_2$—, —S— or —C(CH$_3$)$_2$—).

5. A modified polyimide, which has a structure represented by Formula (V):

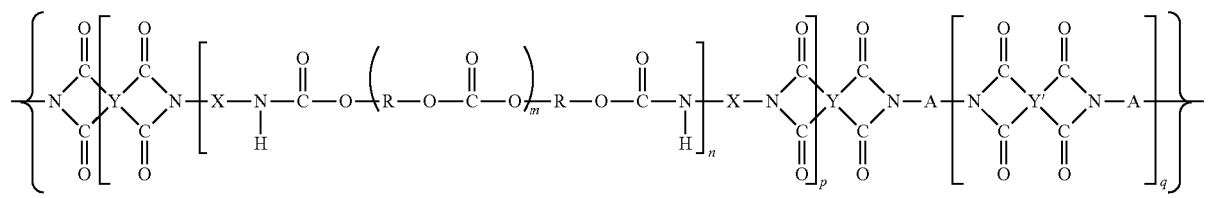

(V)

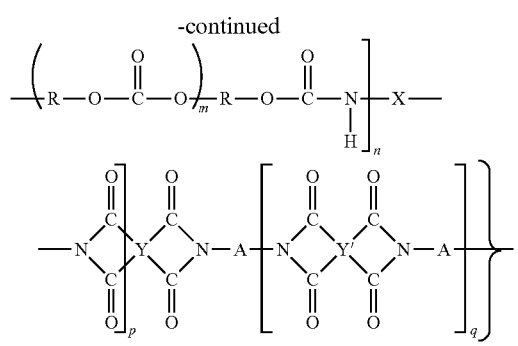

(wherein R has the same meaning as in said Formula (I); X has the same meaning as in said Formula (I); Y has the same meaning as in said Formula (II); m and n have the same meanings as in said Formula (I); p has the same meaning as in said Formula (III); A has the same meaning as in said Formula (IV); Y' has the same meaning as in said Formula (II'); and q represents an integer of 1 to 20),
wherein the weight ratio of the repeating units whose number is represented by said n in said Formula (V) to said modified polyimide represented by said Formula (V) is 0.3 to 0.7 (with the proviso that the weight of X is excluded when X is aromatic).

2. The method according to claim 1, wherein said second step is carried out in a non-nitrogen-containing solvent.

3. The method according to claim 1 or 2, wherein said modified polyimide has a number average molecular weight of 6,000 to 60,000.

4. The method according to claim 1, wherein said A in said Formulae (IV) and (V) has a structure represented by:

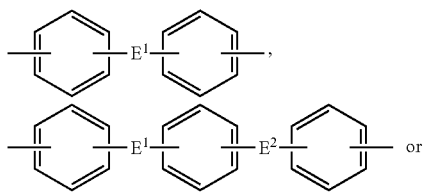

[wherein each R independently represents a C$_1$-C$_{18}$ alkylene group; each X independently represents a C$_1$-C$_{18}$ alkylene group or arylene group, or C$_1$-C$_{18}$ alkylene groups bound through an ether bond(s), ester bond(s), urethane bond(s) or amide bond(s); A represents a divalent aromatic group represented by:

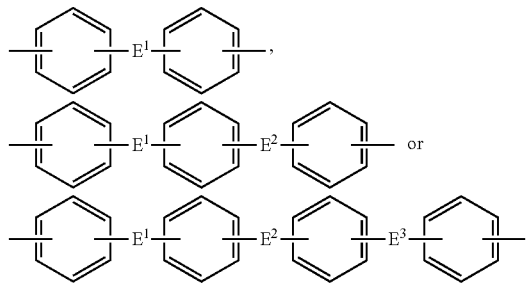

(wherein $E^1$, $E^2$ and $E^3$ each independently represent a direct bond, —O—, —SO$_2$—, —S— or —C(CH$_3$)$_2$—);
Y and Y' each independently represent a tetravalent aromatic group; and m, n, p and q each independently represent an integer of 1 to 20],
wherein the weight ratio of the flexible structures whose number is represented by said n in said Formula (V) to said modified polyimide represented by said Formula (V) is 0.3 to 0.7 (with the proviso that the weight of X is excluded when X is aromatic).

6. The modified polyimide according to claim 5, which has a number average molecular weight of 6,000 to 60,000.

7. A modified polyimide resin composition, which has the modified polyimide according to claim 5 or 6 in an organic solvent.

8. The composition according to claim 7, wherein said organic solvent is a non-nitrogen-containing solvent.

9. The composition according to claim 7, which comprises said modified polyimide resin in an amount of 10 to 50% by weight.

10. The composition according to claim 7, which comprises 1 to 20 parts by weight of a non-halogen flame retardant with respect to 100 parts by weight of said modified polyimide resin.

11. The composition according to claim 7, which comprises, with respect to (A) 100 parts by weight of polyimide, (B) 1 to 1,000 parts by weight of a mixed solvent of two or more solvents, (C) 5 to 20 parts by weight of said non-halogen flame retardant, (D) 5 to 20 parts by weight of organic and/or inorganic particles and (E) 0.1 to 3.0 parts by weight of a coloring agent, antifoaming agent, leveling agent and/or adhesion-imparting agent.

12. The composition according to claim 7, which has a viscosity of 15,000 to 70,000 mPa·s (25° C.).

13. A resin film obtained by forming a film of the modified polyimide resin composition according to claim 7 and heating the thus formed film to remove said solvent.

14. A resin film composed of a cured product of the resin film according to claim 13.

15. A printed circuit board, which is partially or entirely covered with the resin film according to claim 13.

16. An electronic component comprising the resin film according to claim 13.

* * * * *